United States Patent
Hannon et al.

(10) Patent No.: US 8,465,799 B2
(45) Date of Patent: Jun. 18, 2013

(54) METHOD FOR PREPARATION OF FLAT STEP-FREE SILICON CARBIDE SURFACES

(75) Inventors: James B. Hannon, Mahopac, NY (US); Rudolf Tromp, North Salem, NY (US)

(73) Assignee: International Business Machines Corporation, Armonk, NY (US)

( * ) Notice: Subject to any disclaimer, the term of this patent is extended or adjusted under 35 U.S.C. 154(b) by 968 days.

(21) Appl. No.: 12/212,940

(22) Filed: Sep. 18, 2008

(65) Prior Publication Data

US 2010/0065988 A1    Mar. 18, 2010

(51) Int. Cl.
*B05D 5/06* (2006.01)

(52) U.S. Cl.
USPC ............................................. 427/226

(58) Field of Classification Search
USPC .............................................. 427/226
See application file for complete search history.

(56) References Cited

U.S. PATENT DOCUMENTS

| | | | |
|---|---|---|---|
| 5,200,022 A * | 4/1993 | Kong et al. | 117/95 |
| 5,363,800 A | 11/1994 | Larkin et al. | |
| 5,840,117 A * | 11/1998 | Sakamoto et al. | 117/62 |
| 5,910,339 A | 6/1999 | Blakely et al. | |
| 5,915,194 A | 6/1999 | Powell et al. | |
| 6,165,874 A | 12/2000 | Powell et al. | |
| 6,461,944 B2 | 10/2002 | Neudeck et al. | |
| 6,579,359 B1 | 6/2003 | Mynbaeva et al. | |
| 7,244,034 B1 * | 7/2007 | Karandikar et al. | 359/838 |
| 7,247,513 B2 | 7/2007 | Kordina | |
| 7,345,310 B2 * | 3/2008 | Agarwal et al. | 257/77 |
| 7,381,383 B1 * | 6/2008 | Yokoyama et al. | 422/198 |
| 2007/0187694 A1 * | 8/2007 | Pfeiffer | 257/76 |
| 2008/0220620 A1 * | 9/2008 | Kawada et al. | 438/795 |

OTHER PUBLICATIONS

Powell et al., "Growth of Step-Free Surfaces on Device-Size (0001)SiC Mesas," Appl. Phys. Lett., vol. 77. No. 10 (Sep. 2000).
Rainachandran et al., "Preparation of Atomically Flat Surfaces on Silicon Carbide Using Hydrogen Etching," Journal of Electronic Materials, vol. 27, No. 4 (1998).

* cited by examiner

*Primary Examiner* — Michael Cleveland
*Assistant Examiner* — Robert Vetere
(74) *Attorney, Agent, or Firm* — Vazken Alexanian; Michael J. Chang, LLC

(57) ABSTRACT

Techniques for producing atomic step-free silicon carbide surfaces are provided. In one aspect, a method for eliminating atomic steps from a silicon carbide surface is provided. The method comprises the following step. The silicon carbide and a silicon-containing gas are contacted at a temperature, background pressure, and for a length of time sufficient to re-arrange the silicon carbide to an atomic step-free surface. The silicon carbide surface can be the top of a mesa or the bottom of a hole patterned in a silicon carbide wafer.

19 Claims, 7 Drawing Sheets

1350 C, 1e-4 TORR DISILANE

FIG. 6B

1200 C, NO DISILANE

METHOD FOR PREPARATION OF FLAT STEP-FREE SILICON CARBIDE SURFACES

FIELD OF THE INVENTION

The present invention relates to semiconductor material processing, and more particularly, to techniques for producing atomic step-free silicon carbide surfaces that can serve as the basis, for example, for high quality graphene films.

BACKGROUND OF THE INVENTION

Graphene has a very high carrier mobility, making it a suitable material for use in high speed, high performance electronics. However, to attain optimal device performance, very high quality graphene is needed. For example, when graphene films are rough, or domains are small, carrier mobility will be reduced due to enhanced scattering. Producing high quality graphene using conventional techniques is very difficult. For example, one approach to forming graphene involves heating a silicon carbide surface to decompose the silicon carbide into silicon and carbon atoms. The silicon atoms evaporate leaving behind a carbon-rich surface which can orient itself into one or more graphene layers. With this approach, however, the resulting graphene layers have a rough surface morphology and thus may be unsuitable for high-performance device applications.

Figure 1A:
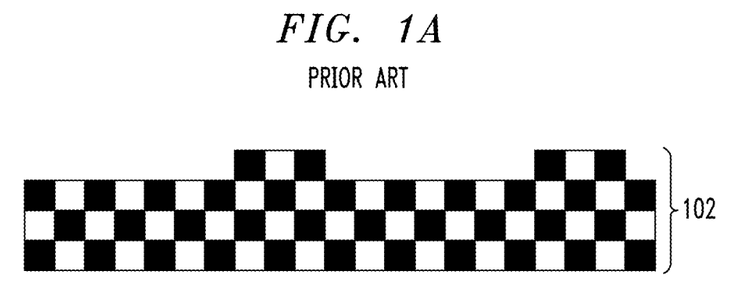
FIGS. 1A-B are cross-sectional diagrams illustrating a conventional graphene forming process.
Figure 1B:
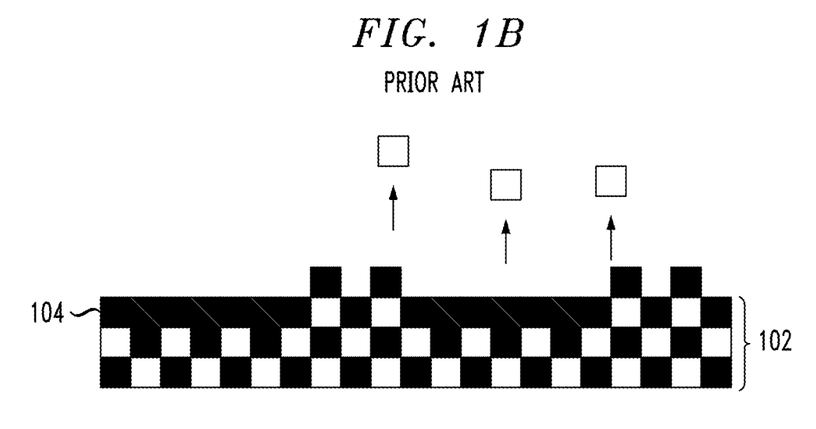

Such a conventional approach is depicted graphically in FIGS. 1A-B. Namely, in FIG. 1A, a silicon carbide wafer 102 is shown. For illustrative purposes, the silicon atoms are represented schematically with white boxes and the carbon atoms are represented schematically with black boxes. With any silicon carbide wafer there is going to be a certain degree of unevenness at the surface which is due to the inability to manufacture atomically-flat surfaces over wafer-scale dimensions. If the surface is not perfectly flat, it will have "atomic steps" defined by laterally undercoordinated silicon and/or carbon atoms.

As shown in FIG. 1B, when the surface of silicon carbide wafer 102 is heated the silicon atoms will evaporate leaving behind a carbon-rich surface arranged into one or more graphene layers 104. However, as illustrated in FIG. 1B, since the foundation for the graphene layers is an uneven surface, and the mobility of carbon and silicon atoms on the surface is relatively low when silicon carbide decomposes in vacuum, the graphene layers too will take on an uneven topology. Thus, the graphene layers formed will have a rough surface morphology.

Therefore, techniques for producing atomic step-free silicon carbide surfaces from which graphene layers can be formed would be desirable.

SUMMARY OF THE INVENTION

The present invention provides techniques for producing atomic step-free silicon carbide surfaces. In one aspect of the invention, a method for eliminating atomic steps from a silicon carbide surface is provided. The method comprises the following step. The silicon carbide and a silicon-containing gas are contacted at a temperature, background pressure, and for a length of time sufficient to re-arrange the silicon carbide to an atomic step-free surface. The silicon carbide surface can be the top of a mesa or the bottom of a hole patterned in a silicon carbide wafer.

A more complete understanding of the present invention, as well as further features and advantages of the present invention, will be obtained by reference to the following detailed description and drawings.

DETAILED DESCRIPTION OF PREFERRED EMBODIMENTS

Figure 2A:
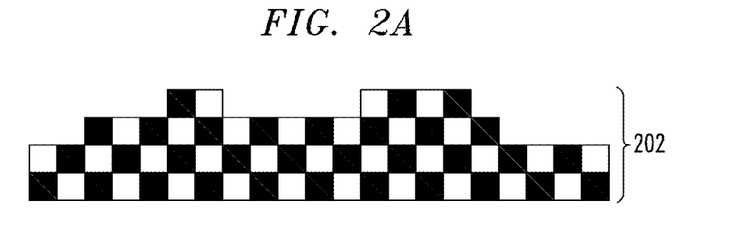
FIGS. 2A-D are cross-sectional diagrams illustrating a method for eliminating atomic steps from a silicon carbide surface according to an embodiment of the present invention.

FIGS. 2A-D are cross-sectional diagrams illustrating an exemplary methodology for eliminating atomic steps from a silicon carbide surface, resulting in an atomic step-free surface which can be used, for example, as the basis for forming high-quality graphene. In FIG. 2A, a silicon carbide wafer 202 is shown. For illustrative purposes, the silicon atoms in the wafer are represented schematically with white boxes and the carbon atoms in the wafer are represented schematically with black boxes. As highlighted above, with any silicon carbide wafer there is going to be a certain degree of unevenness at the surface due to an inability to manufacture atomically-flat surfaces over wafer-scale dimensions, and the surface will have atomic steps defined by laterally undercoordinated silicon and/or carbon atoms. If the wafer in its present state was used to form graphene, the graphene would have an undesirably rough surface morphology (see above).

As will be described in detail below, in order to form an atomic step-free surface on silicon carbide wafer 202, the wafer is heated at high temperatures, e.g., at temperatures greater than or equal to about 900 degrees Celsius (° C.) (see exemplary temperature ranges provided below). Heating the silicon carbide at high temperatures facilitates re-arrangement of the silicon carbide into an atomic step-free surface. Namely, at lower temperatures, e.g., at or around room temperature, there is technically some re-arrangement of the silicon carbide occurring. However, to produce an atomic step-free surface at these low temperatures would literally take many years. Exactly how the silicon carbide re-arranges itself is not entirely known. One theory is that individual silicon carbide molecules are released from and diffuse over the surface re-arranging themselves (see description below). However, it is also speculated that perhaps it is individual silicon and carbon atoms which are released and which diffuse over the surface, eventually re-associating into silicon carbide molecules. The following description will, for ease of description, at points refer to the diffusion of silicon carbide molecules with the understanding that the mechanism is not wholly known and that the individual atoms, and not the molecules, may in fact be the correct units to which reference should be made. The re-arrangement has to occur without the silicon carbide decomposing into graphene. Specifically, with conventional approaches (see above) such high temperature heating would cause the silicon carbide to decompose into graphene. However, once this happens, the opportunity to restructure the surface has passed. As highlighted above, when the silicon carbide decomposes, the silicon evaporates leaving behind a carbon-rich surface, i.e., the basis for graphene. With the present techniques, the decomposition of the silicon carbide into graphene is prevented by the introduction of a silicon-containing gas or vapor to replace the silicon atoms released during the heating process. As long as there is no net loss of silicon, the silicon carbide will not decompose into graphene, even at high temperatures, which permits the individual silicon carbide atoms/molecules to rearrange themselves. Further, the higher the temperature, the faster the silicon carbide atoms/molecules will diffuse over the surface and re-arrange themselves (e.g., the 'speed' of atomic motion varies exponentially with temperature).

Figure 2B:
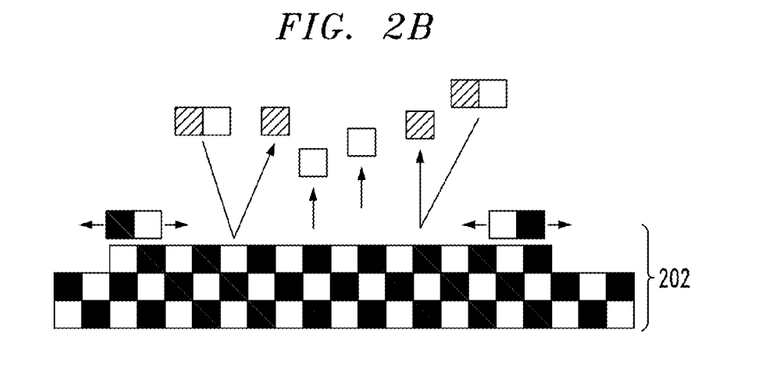

Silicon carbide wafer 202 is heated in the presence of a silicon-containing gas or vapor. The steps of the present methodology are preferably conducted in a vacuum environment such as a vacuum chamber. Suitable silicon-containing gases include, but are not limited to, one or more of silane, disilane, dichlorosilane, methylsilane, chlorosilane, trichlorosilane, dimethylsilane and trimethylsilane. A suitable silicon-containing vapor includes, but is not limited to, a silicon-containing vapor with atomic silicon generated from an evaporation source, such as a piece of a silicon wafer. As shown in FIG. 2B, silicon-containing molecules (each molecule represented schematically with a white box (a silicon atom) in combination with a hatched box (a non-silicon atom(s), e.g., hydrogen)) from the gas or vapor provide silicon atoms to replace those silicon atoms lost during the heating. As stated above, for ease of depiction, silicon carbide molecules are shown with the understanding that re-arrangement of individual silicon and carbon atoms might in fact be occurring. The incident silicon-containing molecules break up at the surface of the wafer, leaving behind the silicon atoms, while the non-silicon atoms evaporate back to the gas phase.

To prevent decomposition of the silicon carbide into graphene, the rate of incorporation of incoming silicon atoms from the gas or vapor has to match the rate at which the silicon atoms evaporate from the surface of silicon carbide wafer 202. See, for example, FIG. 2B wherein it is shown that for the two silicon atoms that are evaporating from the surface of the wafer 202, two silicon atoms are being replaced from the gas or vapor. The representation of an exchange of only two silicon atoms is merely to illustrate that there is no net loss of silicon and as such no decomposition of silicon carbide wafer 202 into graphene at this stage in the process.

As highlighted above, silicon carbide wafer 202 is heated at high temperatures to facilitate the release of individual silicon carbide atoms/molecules and to promote the atoms/molecules to re-arrange themselves into an atomic-step free surface. According to an exemplary embodiment, the wafer is heated (in the presence of a background pressure of the silicon-containing gas or vapor) to a temperature of greater than or equal to about 900° C., for example, from about 900° C. to about 2,000° C. and any ranges therebetween, e.g., from about 1,000° C. to about 1,600° C. and any ranges therebetween. Any temperatures within these exemplary ranges will facilitate the release of individual silicon carbide atoms/molecules and promote those atoms/molecules to diffuse freely over the surface of the wafer (see FIG. 2B). As highlighted above, the higher the temperature, the faster the individual silicon carbide atoms/molecules will diffuse over the surface and re-arrange themselves. Using the above temperature ranges, the individual silicon carbide atoms/molecules will re-arrange themselves to form an atomic step-free surface within a time period of less than or equal to about five hours, e.g., less than or equal to about two hours. As explained above, while re-arrangement of the silicon carbide molecules may occur at temperatures less than those presented above, this re-arrangement will not happen in a feasible time period.

To prevent decomposition of the silicon carbide into graphene during the heating, the background pressure of the silicon-containing gas or vapor must be set such that there is no net loss of silicon atoms (see above). According to an exemplary embodiment, based on the temperatures provided above, a background silicon vapor pressure of from about $1 \times 10^{-10}$ Torr to about one Torr and any ranges therebetween, for example, from about $1 \times 10^{-6}$ Torr to about one Torr and any ranges therebetween, e.g., from about $1 \times 10^{-4}$ Torr to about $1 \times 10^{-2}$ Torr and any ranges therebetween is used to prevent decomposition of the silicon carbide. See, for example, graph 500 in FIG. 5, described below, which relates temperature and pressure values at which graphene formation does or does not occur.

Figure 2C:
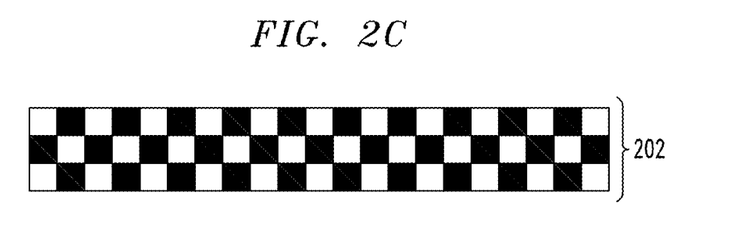
Figure 2D:
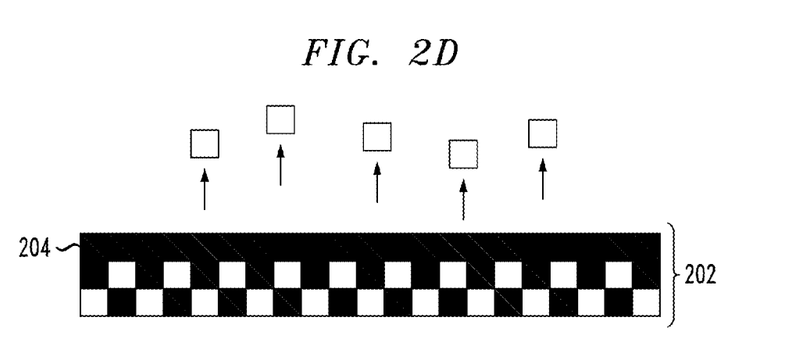

As shown in FIG. 2C, the result is silicon carbide wafer 202 having a flat, atomic step-free surface, which provides an excellent base for forming high quality graphene layers (with a smooth surface morphology). For example, as shown in FIG. 2D, once a flat surface is achieved on silicon carbide wafer 202 using the steps described above, the silicon carbide can be permitted to decompose into graphene. This can be achieved in a number of ways. Assume from the above-described steps that the wafer is presently being subjected to a temperature/background silicon vapor pressure that promotes diffusion of the individual silicon carbide atoms/molecules but wherein decomposition is prevented. The temperature can then be increased (with the background silicon vapor pressure held constant) to a point at which decomposition occurs. See, for example, FIG. 5, described below. Alternatively, the background silicon vapor pressure can be decreased (with the temperature held constant) to a point at which decomposition occurs. See, for example, FIG. 5, described below. Lastly, any coordinated change in both the pressure and temperature that brings the system to a state at which decomposition occurs can also be employed. See, for example, FIG. 5, described below.

Thus, the silicon carbide will decompose into silicon atoms, which evaporate from the surface (see FIG. 2D), and carbon atoms. The resulting carbon-rich surface on the wafer will orient itself into one or more graphene layers 204. When multiple graphene layers are formed, the graphene layers can be oriented in a stacked configuration and, depending on how the layers are shifted relative to one another, can form graphite.

There may be instances where more graphene layers are present than are desired (formed by the above-described process and/or from another source). By way of example only, five graphene layers may be formed when only two graphene layers are desired (i.e., perhaps in some situation(s) two graphene layers provide better electrical properties than five layers). Advantageously, the present techniques can be used to reduce the number of graphene layers formed. Namely, the graphene layers can be exposed to the above-described silicon-containing gas or vapor, which will convert a portion of the graphene back to silicon carbide.

Figure 3A:
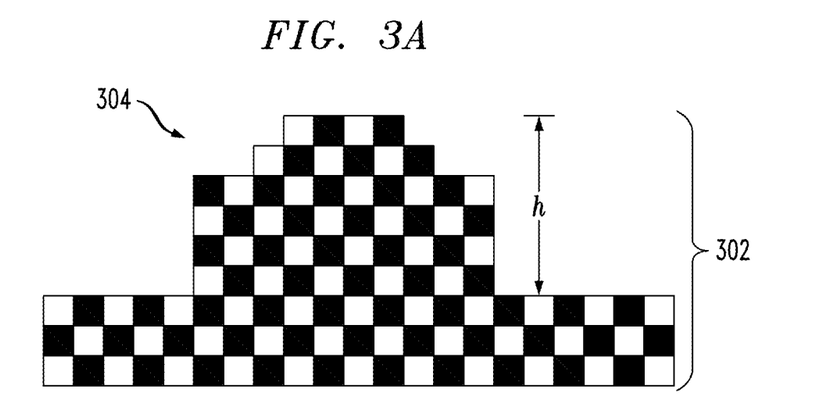
FIGS. 3A-D are cross-sectional diagrams illustrating a method for forming an atomic step-free mesa patterned in a silicon carbide wafer according to an embodiment of the present invention.

The above-described techniques can be applied to produce atomic step-free surface features, such as mesas and holes, patterned in a silicon carbide wafer. For example, FIGS. 3A-D are cross-sectional diagrams illustrating an exemplary methodology for forming an atomic step-free mesa patterned in a silicon carbide wafer. In FIG. 3A, a silicon carbide wafer 302 is shown having a mesa 304 patterned therein. Any standard patterning techniques can be used to form the mesa, including, but not limited to photolithography, electron-beam (e-beam) lithography or ion beam lithography. According to an exemplary embodiment, the mesa has a height h of from about one nanometer (nm) to about one micrometer (μm) (it is notable that h is significantly greater than the thickness of a single silicon carbide layer (e.g., about 2.5 Angstroms (Å)). For illustrative purposes, the silicon atoms in the wafer are represented schematically with white boxes and the carbon atoms in the wafer are represented schematically with black boxes.

With any of the above patterning techniques, there is going to be a certain degree of unevenness at the top surface of the mesa which is the result of laterally undercoordinated silicon and/or carbon atoms. As a result, atomic steps will be present on the top of the mesa. If the wafer in its present state was used to form graphene, the graphene would have an undesirably rough surface morphology in the patterned region.

Figure 3B:
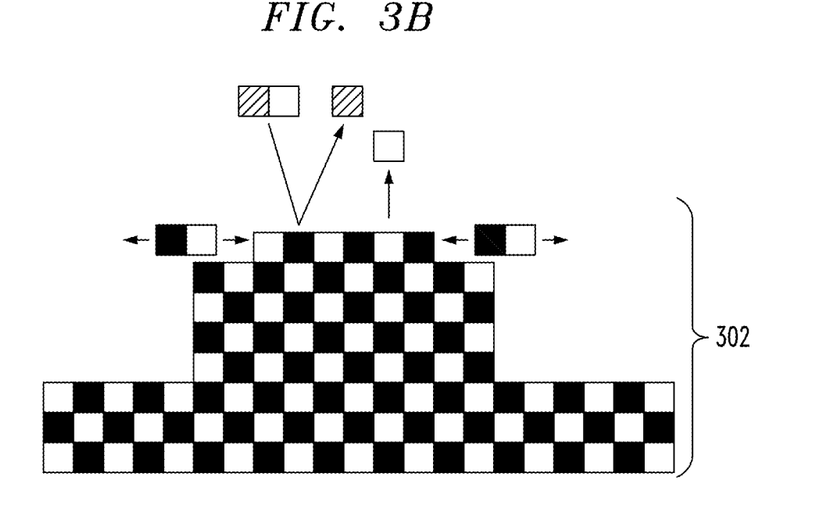

To produce an atomic step-free mesa, the wafer is heated to a high temperature (see above) which permits the individual silicon carbide atoms/molecules to diffuse freely about the mesa surface. As described, for example, in conjunction with the description of FIGS. 2A-D above, the heating is conducted in the presence of a silicon-containing gas or vapor to prevent decomposition of the silicon carbide into graphene during the heating. As shown in FIG. 3B, silicon-containing molecules (each molecule represented schematically with a white box (a silicon atom) in combination with a hatched box (a non-silicon atom(s), e.g., hydrogen)) from the gas or vapor provide silicon atoms to replace those silicon atoms lost during the heating. As above, for ease of depiction, silicon carbide molecules are shown with the understanding that re-arrangement of individual silicon and carbon atoms may in fact be occurring.

To understand how the atomic steps are eliminated from the top of the mesa it is easiest to think about the mesa as consisting of stacks of layers of silicon carbide. In the simplest case, mesa 304 is cylindrical and FIGS. 3A-D depict cross-sectional cuts through stacks of circular layers. Silicon carbide in a circular layer with a large radius (relative to the other layers) is more stable than silicon carbide in a circular layer with a small radius (relative to the other layers). The reason for this is that a small-radius layer has a larger percentage of atoms at the boundary of the layer than a large-radius layer, and atoms at the boundary (e.g., atoms at the edge of the layer that are missing some of their lateral binding partners) are more weakly bound (because they are missing some of their bonding partners). When the silicon carbide is heated, atoms at the edge of a layer will detach, diffuse around, and attach to another layer (re-arrange themselves). This will happen randomly to all layers. But since the large-radius layers are more stable, there will be a slight bias towards attaching to these layers. As a consequence, these large-radius layers grow, while small-radius layers shrink, on average. So the surface roughness at the top of a mesa can be thought of as an ensemble of layers with very small radii, which will rapidly decay, while the larger radii layers that comprise the "walls" of the mesa will grow. Basically, the heating (above certain temperatures, see above) permits the silicon carbide molecules to more easily diffuse over the surface and find the layers with large radii.

Figure 3C:
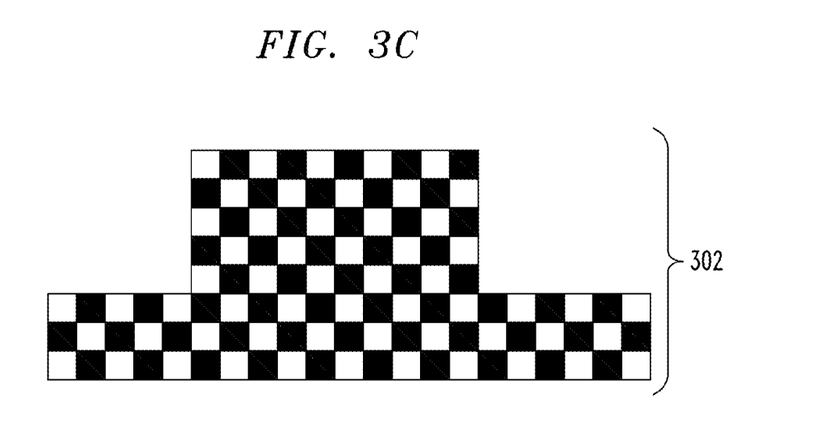
Figure 3D:
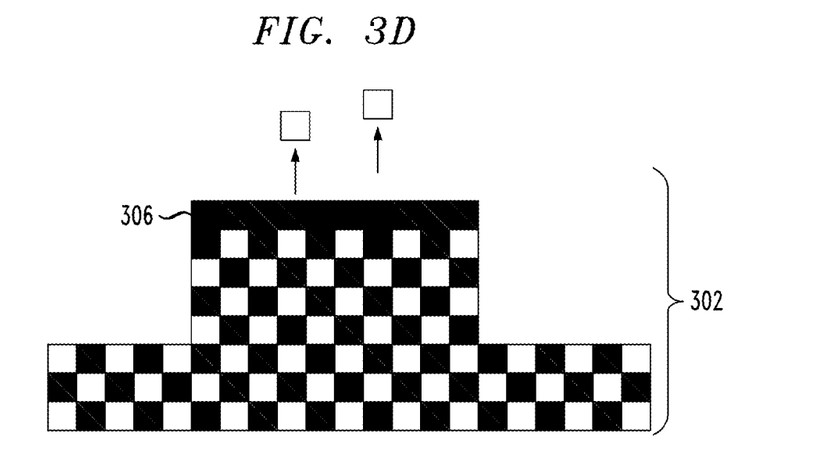

As shown in FIG. 3C, the result of this re-arrangement of silicon carbide molecules (under the proper temperature/background silicon vapor pressure combination) is mesa 304 having a flat, atomic step-free surface, which provides an excellent base for forming high quality graphene layers (with a smooth surface morphology). For example, as shown in FIG. 3D, once a flat surface is achieved on mesa 304 using the steps described above, the silicon carbide can be permitted to decompose at the surface. According to an exemplary embodiment, either the temperature is increased (with the background silicon vapor pressure held constant) to a point at which decomposition occurs, or the background silicon vapor pressure is decreased (with the temperature held constant) to a point at which decomposition occurs.

As a result, the silicon carbide will decompose into silicon atoms, which are released (see FIG. 3D), and carbon atoms. The carbon-rich surface left on the wafer will orient itself into one or more graphene layers 306.

Figure 4A:
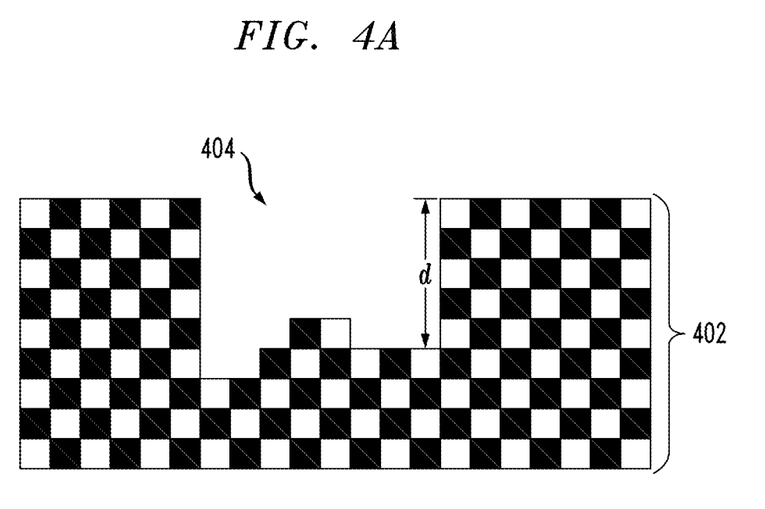
FIGS. 4A-D are cross-sectional diagrams illustrating a method for forming an atomic step-free hole patterned in a silicon carbide wafer according to an embodiment of the present invention.

FIGS. 4A-D are cross-sectional diagrams illustrating an exemplary methodology for forming an atomic step-free hole patterned in a silicon carbide wafer. In FIG. 4A, a silicon carbide wafer 402 is shown having a hole 404 patterned therein. Any standard patterning techniques can be used to form the hole, including, but not limited to photolithography, e-beam lithography or ion beam lithography. According to an exemplary embodiment, the hole has a depth d of from about one nm to about one μm (as above, it is notable that d is significantly greater than the thickness of a single silicon carbide layer (e.g., about 2.5 Å)). For illustrative purposes, the silicon atoms in the wafer are represented schematically with white boxes and the carbon atoms in the wafer are represented schematically with black boxes. As above, for ease of depiction, silicon carbide molecules are shown with the understanding that re-arrangement of individual silicon and carbon atoms may in fact be occurring.

With any of the above patterning techniques, there is going to be a certain degree of unevenness at the bottom surface of the hole which is the result of laterally undercoordinated silicon and/or carbon atoms. As a result, atomic steps will be present at the bottom of the hole. If the wafer in its present state was used to form graphene, the graphene would have an undesirably rough surface morphology in the patterned region.

Figure 4B:
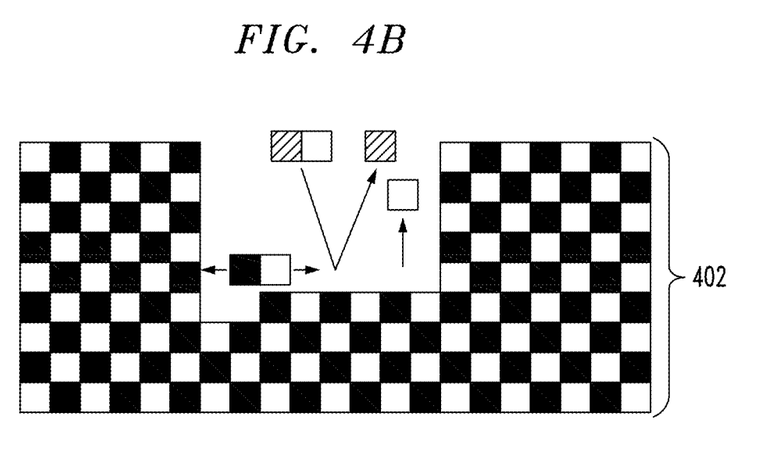

To produce an atomic step-free hole, the wafer is heated to high temperatures (see above) which permits the individual silicon carbide atoms/molecules to diffuse freely. As described, for example, in conjunction with the description of FIGS. 2A-D above, the heating is conducted in the presence of a silicon-containing gas or vapor to prevent decomposition of the silicon carbide into graphene during the heating. As shown in FIG. 4B, silicon-containing molecules (each molecule represented schematically with a white box (a silicon atom) in combination with a hatched box (a non-silicon atom(s), e.g., hydrogen)) from the gas or vapor provide silicon atoms to replace those silicon atoms lost during the heating.

To understand how the atomic steps are eliminated from the bottom of the hole it is easiest to think about the hole as consisting of missing stacks of layers of silicon carbide. In the simplest case, hole 404 is cylindrical and is formed by removing circular layers. Silicon carbide in a layer with a large-radius circular hole (relative to the other layers) is more stable than silicon carbide in a layer with a small-radius circular hole (relative to the other layers). The reason for this is that when diffusing silicon carbide attaches to a small-radius hole, there is a larger fractional change in the perimeter of the hole as compared to when the same amount of silicon carbide attaches to a larger radius hole. Therefore, there is a slight bias for diffusing silicon carbide to attach to smaller radius holes.

A small-radius hole has a larger percentage of atoms at the boundary (e.g., at the edge of the hole) than a large-radius hole, and atoms at the boundary are more weakly bound. When the silicon carbide is heated, atoms at the edge of a hole will detach, diffuse around, and attach to another layer. This will happen randomly to all layers. But since the layers with the larger radius holes are more stable, there will be a slight bias towards attaching to these layers. As a consequence, these layers grow, while layers with smaller radius holes shrink, on average. So the surface roughness at the bottom of a hole can be thought of as an ensemble of layers with very small radii, which will rapidly decay, while the larger radii layers that comprise the "walls" of the hole will grow. Basically, the heating (above certain temperatures, see above) permits the individual silicon carbide atoms/molecules to easily diffuse over the surface and find the layers with the large radii. Small holes have a tendency to fill in more quickly relative to larger holes. There is a small bias for small-radius holes to capture diffusing silicon carbide, so they preferentially shrink.

The re-arrangement of the silicon carbide molecules under the conditions of the present techniques (i.e., high temperatures combined with a background pressure of a silicon-containing gas or vapor) can be further described as follows. When a circular silicon carbide layer is created, there are atoms at the edge of the layer that are missing some of their lateral bonding partners. This makes the whole layer a bit unstable. The extra energy cost of the circular layer is proportional to the perimeter. The same is true for a circular hole in a silicon carbide layer. Namely, the extra cost to make the hole is roughly proportional to the perimeter. When the silicon carbide is heated, there will be an evolution towards lower energy, which means, e.g., reducing the total perimeter of all the circular layers. Now consider the best place to take silicon carbide from and the best place to put it. The best place to take silicon carbide from is a small perimeter circular layer because the decrease in the perimeter will be larger than if the same amount of silicon carbide is taken from a large perimeter layer. A simple example would be a circular layer consisting of two silicon carbide molecules. If one silicon carbide molecule is taken away, the perimeter is cut in half. In contrast, if a molecule is taken away from a 10,000 silicon carbide molecule circular layer, the change in perimeter is much smaller. By the same logic, the best place to put silicon carbide is at the edge of a small hole because, again, the perimeter will be reduced by a large fraction. So when a mesa is heated as described herein, the small-perimeter layers will disappear fastest. Similarly, when a hole is heated as described herein, the tiny spaces at the bottom of the hole will fill in soonest.

Figure 4C:
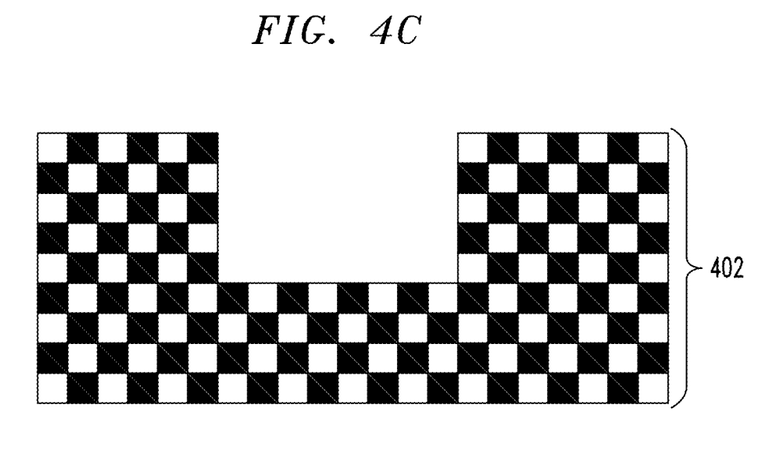
Figure 4D:
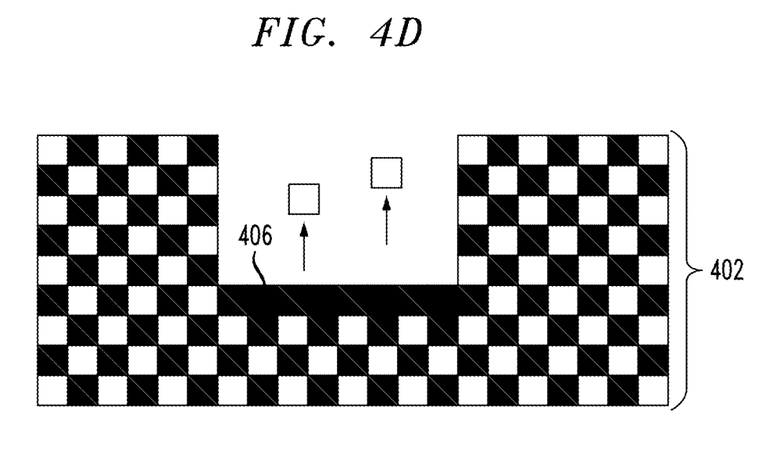

As shown in FIG. 4C, the result of this re-arrangement of silicon carbide molecules (under the proper temperature/background silicon vapor pressure combination) is hole 404 having a flat, atomic step-free bottom, which provides an excellent base for forming high quality graphene layers (with a smooth surface morphology). For example, as shown in FIG. 4D, once a flat bottom is achieved in hole 404 using the steps described above, the silicon carbide can be permitted to decompose. According to an exemplary embodiment, either the temperature is increased (with the background silicon vapor pressure held constant) to a point at which decomposition occurs, or the background silicon vapor pressure is decreased (with the temperature held constant) to a point at which decomposition occurs.

As a result, the silicon carbide will decompose into silicon atoms, which are released (see FIG. 4D), and carbon atoms. The carbon-rich surface left at the bottom of the hole will orient itself into one or more graphene layers 406.

Figure 5:
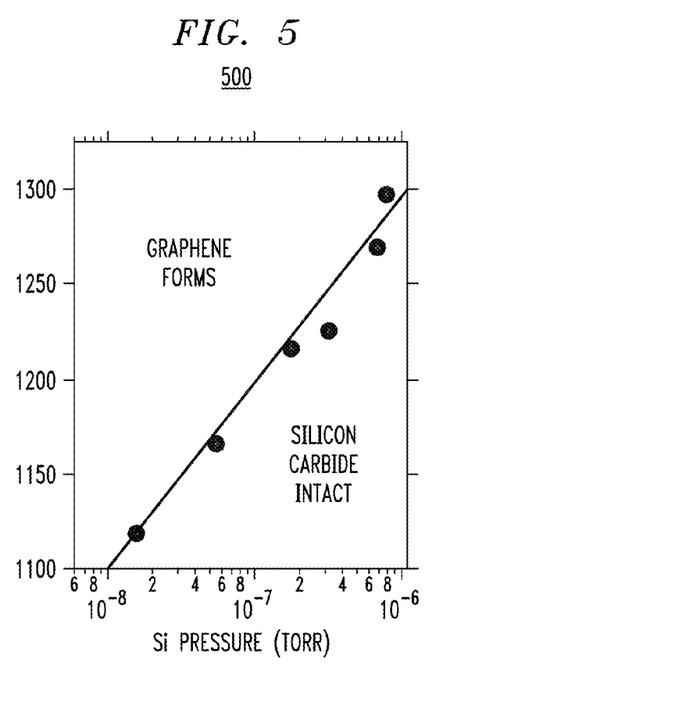
FIG. 5 is a graph illustrating silicon carbide decomposition as a function of temperature and background pressure of a silicon-containing gas according to an embodiment of the present invention.

The present techniques are further described by reference to the following non-limiting examples. In the first example, it is shown that a background pressure of a silicon-containing gas prevents the decomposition of silicon carbide. Namely, low-energy electron microscopy (LEEM) was used to image a silicon carbide substrate SiC(0001) surface during exposure to disilane ($Si_2H_6$). Disilane is a typical silicon-containing gas. LEEM is an electron microscopy that measures the electron reflectivity (i.e., the fraction of electrons reflected from a surface). As described above, when silicon carbide decomposes, graphene is formed. Graphene has a very different electron reflectivity from silicon carbide, so it is easy to detect when graphene forms. The temperature at which graphene forms (i.e., the temperature at which silicon carbide decomposes) was measured as a function of the background disilane pressure. The results are shown illustrated in FIG. 5. Namely, FIG. 5 is graph 500 illustrating silicon carbide decomposition (graphene formation) as a function of temperature and background pressure of a silicon-containing gas. Graph 500 shows that, at a very low background pressure of disilane, silicon carbide decomposes at a temperature of about 1,100° C., whereas in a background pressure of $1 \times 10^{-6}$ Torr disilane, the decomposition does not occur until 1,300° C.

Figure 6A:
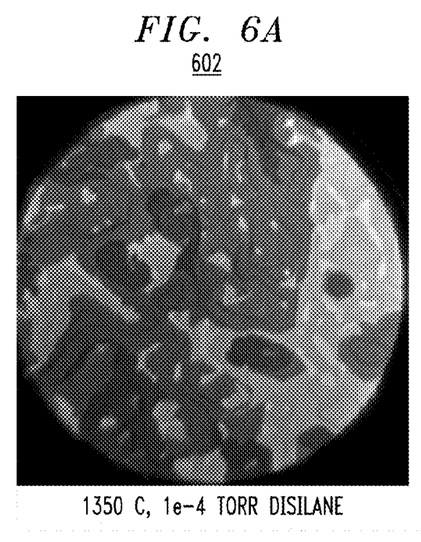
FIGS. 6A-B are images of graphene formation on a silicon carbide wafer both with and without a silicon-containing gas being present according to an embodiment of the present invention.
Figure 6B:
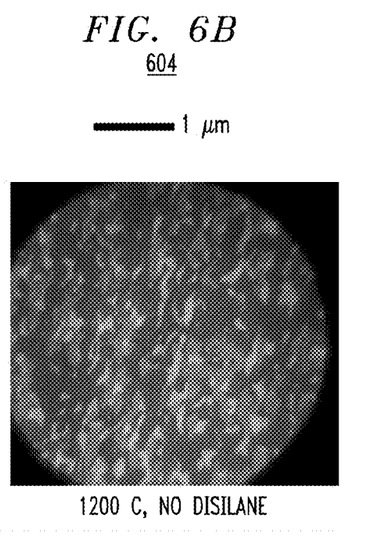

In the second example, it is shown that high temperature heating in the presence of a silicon-containing gas or vapor improves graphene film quality. Namely, the results of two LEEM experiments are shown in FIGS. 6A-B. FIGS. 6A-B are images of SiC(0001) wafers after the formation of about two layers of graphene. Specifically, FIG. 6A is image 602 of a SiC(0001) wafer heated in the presence of a silicon-containing gas. FIG. 6B is image 604 of a SiC(0001) wafer heated without a silicon-containing gas present. The contrast in each image is due to spatial variation in the thickness of the graphene layer. The bright regions correspond to one layer of graphene, the gray regions correspond to two layers of graphene and the darkest regions correspond to three layers of graphene. The one micrometer scale bar shown applies to both images 602 and 604 (i.e., image 602 has a five μm diameter and image 604 has a four μm diameter). Image 604 was obtained after annealing a silicon carbide sample to 1,200° C. in ultra-high vacuum for about five minutes with no disilane in the background. The key feature of image 604 is its small domain size. The characteristic length scale is only about 0.2 μm. Image 602 is from a sample annealed to 1,350° C. in a background pressure of $1 \times 10^{-4}$ Torr disilane. The characteristic feature size is five to 10 times larger for the sample annealed in disilane, indicating that mass transport is enhanced by the presence of the disilane gas, while the number of graphene layers is comparable even though the sample was annealed to a much higher temperature. This shows that a smoother graphene film results when the surface is heated in disilane at high temperatures.

Although illustrative embodiments of the present invention have been described herein, it is to be understood that the invention is not limited to those precise embodiments, and that various other changes and modifications may be made by one skilled in the art without departing from the scope of the invention.

What is claimed is:
1. A method for eliminating atomic steps from a silicon carbide surface, comprising the step of:
   contacting the silicon carbide and a silicon-containing gas at a temperature, background pressure, and for a length of time sufficient to re-arrange the silicon carbide to an atomic step-free surface while preventing decomposition of the silicon carbide into graphene, wherein the temperature is from about 900 degrees Celsius to about 1,200 degrees Celsius.

2. The method of claim 1, wherein the silicon-containing gas replaces silicon atoms that evaporate at the contacting temperature thereby preventing a net loss of silicon atoms.

3. The method of claim 1, wherein the silicon-containing gas is formed from a silicon-containing compound selected from the group consisting of: silane, disilane, dichlorosilane, methylsilane, chlorosilane, trichlorosilane, dimethylsilane and trimethylsilane.

4. The method of claim 1, wherein the background pressure is from about $1 \times 10^{-10}$ Torr to about one Torr.

5. The method of claim 1, wherein the background pressure is from about $1 \times 10^{-6}$ Torr to about one Torr.

6. The method of claim 1, wherein the background pressure is from about $1 \times 10^{-4}$ Torr to about $1 \times 10^{-2}$ Torr.

7. The method of claim 1, wherein the length of time is less than or equal to about five hours.

8. The method of claim 1, wherein the length of time is less than or equal to about two hours.

9. The method of claim 1, wherein the temperature employed facilitates individual silicon carbide molecules to be released from and diffuse across the surface.

10. The method of claim 1, wherein the temperature employed facilitates individual silicon and carbon atoms to be released from and diffuse across the surface.

11. The method of claim 1, further comprising the step of:
permitting the silicon carbide to decompose after the atomic step-free surface is formed into silicon atoms, which evaporate, and carbon atoms which form one or more graphene layers.

12. The method of claim 11, wherein the step of permitting the silicon carbide to decompose further comprises the step of:
increasing the temperature, while keeping the background pressure constant, to a temperature at which the silicon carbide decomposes into the graphene.

13. The method of claim 11, wherein the step of permitting the silicon carbide to decompose further comprises the step of:
decreasing the background pressure, while keeping the temperature constant, to a pressure at which the silicon carbide decomposes into the graphene.

14. The method of claim 1, wherein the silicon-containing gas is a silicon-containing vapor comprising atomic silicon generated from an evaporation source.

15. The method of claim 14, wherein the evaporation source is a silicon wafer.

16. The method of claim 1, wherein the silicon carbide surface comprises a top of a mesa patterned in a silicon carbide wafer.

17. The method of claim 16, wherein the mesa has a height of from about one nanometer to about one micrometer.

18. The method of claim 1, wherein the silicon carbide surface comprises a bottom of a hole patterned in a silicon carbide wafer.

19. The method of claim 18, wherein the hole has a depth of from about one nanometer to about one micrometer.

* * * * *